(12) United States Patent
Ishimatsu et al.

(10) Patent No.: US 8,796,557 B2
(45) Date of Patent: Aug. 5, 2014

(54) ADHESIVE FILM, CONNECTING METHOD, AND JOINED STRUCTURE

(75) Inventors: Tomoyuki Ishimatsu, Tochigi (JP); Hiroki Ozeki, Tochigi (JP)

(73) Assignee: Dexerials Corporation, Shinagawa-ku, Tokyo (JP)

( * ) Notice: Subject to any disclaimer, the term of this patent is extended or adjusted under 35 U.S.C. 154(b) by 150 days.

(21) Appl. No.: 12/645,883

(22) Filed: Dec. 23, 2009

(65) Prior Publication Data

US 2010/0096175 A1    Apr. 22, 2010

Related U.S. Application Data

(63) Continuation of application No. PCT/JP2008/061320, filed on Jun. 20, 2008.

(30) Foreign Application Priority Data

Jun. 27, 2007    (JP) .................................. 2007-168964

(51) Int. Cl.
*H05K 1/02*    (2006.01)
*H05K 1/00*    (2006.01)
*H05K 1/03*    (2006.01)
*H05K 1/09*    (2006.01)

(52) U.S. Cl.
USPC ........... 174/259; 174/250; 174/255; 174/256; 174/257; 174/258

(58) Field of Classification Search
USPC .................. 174/250, 260, 255–259; 428/343, 428/355 R; 438/644; 349/150
See application file for complete search history.

(56) References Cited

U.S. PATENT DOCUMENTS 5,087,494 A * 2/1992 Calhoun et al. ............... 428/40.1
6,034,331 A * 3/2000 Tsukagoshi et al. .......... 174/250

(Continued)

FOREIGN PATENT DOCUMENTS

JP    7-230840 A    8/1995
JP    2005-146044 A    6/2005

(Continued)

OTHER PUBLICATIONS

International Search Report for PCT/JP2008/061320 completed Jul. 14, 2008.

(Continued)

*Primary Examiner* — Jeremy C Norris
*Assistant Examiner* — Sherman Ng
(74) *Attorney, Agent, or Firm* — Buchanan Ingersoll & Rooney PC

(57) ABSTRACT

An adhesive film, containing a first adhesive layer in which conductive particles are dispersed, and a second adhesive layer adhered to the first adhesive layer, wherein the lowest viscosity of the first adhesive layer attained at or below the curing temperature is higher than that of the second adhesive layer attained at or below the curing temperature, where the curing temperature is a temperature at which the adhesive layer starts to cure, wherein the first and second adhesive layers are respectively disposed to a substrate side and an electronic part side, and the adhesive film is configured to join the electronic part and the substrate by heating and pressurizing the substrate and the electronic part with the adhesive layer being therebetween, and wherein the first adhesive layer has a thickness which is less than two times of an average particle diameter of the conductive particles.

19 Claims, 4 Drawing Sheets

(56) References Cited

U.S. PATENT DOCUMENTS

| | | | |
|---|---|---|---|
| 6,223,429 B1* | 5/2001 | Kaneda et al. | 29/832 |
| 6,251,502 B1* | 6/2001 | Yasue et al. | 428/209 |
| 6,303,219 B1* | 10/2001 | Sawamura et al. | 428/343 |
| 6,376,050 B1* | 4/2002 | Terasaki et al. | 428/209 |
| 6,376,053 B1* | 4/2002 | Nakamura et al. | 428/209 |
| 6,512,031 B1* | 1/2003 | Honda et al. | 524/115 |
| 6,583,834 B1* | 6/2003 | Uchiyama | 349/122 |
| 2001/0046021 A1* | 11/2001 | Kozuka et al. | 349/150 |
| 2002/0173145 A1* | 11/2002 | Honda et al. | 438/644 |
| 2004/0014843 A1* | 1/2004 | Sumita et al. | 523/400 |
| 2005/0178501 A1* | 8/2005 | Nakamura et al. | 156/307.1 |
| 2005/0288427 A1* | 12/2005 | Jeon et al. | 524/555 |
| 2006/0240198 A1* | 10/2006 | Tanikawa et al. | 428/1.53 |

FOREIGN PATENT DOCUMENTS

| | | |
|---|---|---|
| JP | 2005-200521 A | 7/2005 |
| JP | 2006-32335 A | 2/2006 |
| KR | 10-2006-0123491 A | 12/2006 |
| WO | WO 01/71854 A1 | 9/2001 |

OTHER PUBLICATIONS

Written Opinion for PCT/JP2008/061320 completed Jul. 14, 2008.
International Preliminary Report on Patentability for PCT/JP2008/061320 completed Sep. 26, 2008.
Official Action issued on Aug. 31, 2011 by the Korean Patent Office in corresponding Korean Patent Application No. 10-2010-7001236.

* cited by examiner

ADHESIVE FILM, CONNECTING METHOD, AND JOINED STRUCTURE

CROSS-REFERENCE TO RELATED APPLICATION

This is a continuation of Application No. PCT/JP2008/061320, filed on Jun. 20, 2008.

BACKGROUND OF THE INVENTION

1. Field of the Invention

The present invention relates to an adhesive film capable of connecting an electrical part to a substrate, a connection method thereof, and a joined structure.

2. Description of the Related Art

An anisotropic conductive adhesive, in which conductive particles are dispersed in an adhesive, has been conventionally used for a connection of an electronic part or a wiring board. When the anisotropic conductive adhesive is placed between the surface of the substrate where the terminals are disposed and the surface of the electronic part where the terminals are disposed, and heated and pressurized, the softened binder is pushed out from the space between the terminal of the substrate and the terminal of the electronic part, and the conductive particles are held between the terminal of the substrate and the terminal of the electronic part, to thereby electrically join the substrate and the electronic part, However, when the binder is pushed out, part of the conductive particles are pushed out together with the binder, and the pushed conductive particles are moved into the space between the adjacent terminals of the substrate or the adjacent terminals of the electronic part, which may cause a short circuit due to the conductive particles present between the adjacent terminals.

Moreover, when the conductive particles are pushed out from the space between the terminal of the substrate and the terminal of the electronic part, the number of the conductive particles which the terminal of the substrate and the terminal of the electronic part can hold is decreased, lowering the conduction reliability (see Japanese Patent Application Laid-Open (JP-A) Nos. 2006-32335 and 07-230840).

BRIEF SUMMARY OF THE INVENTION

The present invention aims at solving the problems in the art, and achieving the following object.

An object of the present invention is to provide an adhesive film, a joining method, and a joined structure, which are capable of connecting an electronic part to a substrate without causing a short circuit.

The means for solving the aforementioned problem are as follow:

<1> An adhesive film, containing:
a first adhesive layer in which conductive particles are dispersed; and
a second adhesive layer adhered to the first adhesive layer,
wherein the lowest viscosity of the first adhesive layer attained at or below a curing temperature thereof is higher than the lowest viscosity of the second adhesive layer attained at or below a curing temperature thereof, where the curing temperature is a temperature at which the adhesive layer starts to cure,
wherein the first adhesive layer and the second adhesive layer are respectively disposed at a side of a substrate and a side of an electronic part, and the adhesive film is configured to join the electronic part and the substrate by heating and pressurizing the substrate and the electronic part with the adhesive film being therebetween, and
wherein the first adhesive layer has a thickness which is less than two times of an average particle diameter of the conductive particles.

<2> The adhesive film according to <1>, wherein the lowest viscosity of the second adhesive layer is 0.05 times to 0.2 times of the lowest viscosity of the first adhesive layer containing the conductive particles.

<3> The adhesive film according to any of <1> or <2>, wherein a difference between the temperature at which the first adhesive layer has the lowest viscosity and the temperature at which the second adhesive layer has the lowest viscosity is 10° C. or less.

<4> A joining method, containing:
placing terminal of a substrate and terminal of an electronic part so as to face to each other via the adhesive film as defined in any one of <1> to <3>; and
heating and pressurizing the substrate and the electronic part so as to join the substrate and the electronic part with the conductive particles contained in the adhesive layer being held between the terminal of the substrate and the terminal of the electronic part.

<5> A joined structure, containing
a substrate; and
an electronic part,
wherein the substrate and the electronic part are joined by the method as defined in <4>.

According to the present invention, various problems in the art can be solved, the aforementioned object can be achieved, and an adhesive film, a joining method, and a joined structure, which are which are capable of connecting an electronic part to a substrate without causing a short circuit, can be provided.

FIG. 5 is a graph showing a relationship between the viscosity and the adhesive and the temperature, and the transverse axis and longitudinal axis of the graph show the temperature of the adhesive and the viscosity (MPa), respectively. note that, the longitudinal axis in FIG. 5 is logarithmic representation.

As shown in FIG. 5, as the temperature of the adhesive containing the thermosetting resin is increased, the viscosity of the adhesive decreases until a certain temperature (here, about 100° C.) range, but the viscosity thereof increases after the certain temperature because the thermosetting resin starts polymerizing.

In the present invention, the lowest viscosity is, for example, a viscosity at a curing temperature at which the thermosetting resin contained in the adhesive layer starts polymerizing, namely the temperature at which the viscosity is turned increasing from decreasing.

The reference A in FIG. 5 shows the relationship between the viscosity of the adhesive (the first adhesive layer) in the state where the conductive particles are dispersed therein, and the temperature, and the reference N shows the relationship between the viscosity of the adhesive (the second adhesive layer) in which no conductive particles are dispersed, and the temperature.

In the case where the first adhesive layer and the second adhesive layer each contain thermosetting resin, thermoplastic resin, and the like, the lowest viscosity of the first adhesive layer can be made higher than the lowest viscosity of the second adhesive layer, as shown in FIG. 5, by changing the type or formulated amount of the thermosetting resin, or the type or formulated amount of the thermoplastic resin.

The first adhesive layer has higher viscosity than that of the second adhesive layer at least until the viscosity of the first adhesive layer reaches the lowest viscosity, and thus the first adhesive layer has a low fluidity compared to the second adhesive layer at least until the curing starts, and the conductive particles of the first adhesive layer have low mobility.

It is preferred that a curing agent be added to the first and second adhesive layers so as to accelerate the polymerization of the thermosetting resin. As shown in FIG. 5, a difference between the curing temperature of the first adhesive layer and the curing temperature of the second adhesive layer can be made 10° C. or less, by changing the type or formulated amount of the thermosetting resin used in the first and second adhesive layers, or the type or formulated amount of the curing agent used in the first and second adhesive layers.

In the present invention, as the amount of the conductive particles pushed out from the space between the terminals facing to each other is decreased, the number of the conductive particles captured between the terminals facing to each other is increased, and thus a joined structure of high conduction reliability is attained without a short circuit due to the conductive particles present between the terminals adjacent to each other.

DETAILED DESCRIPTION OF THE INVENTION

Adhesive Film

Figure 1:
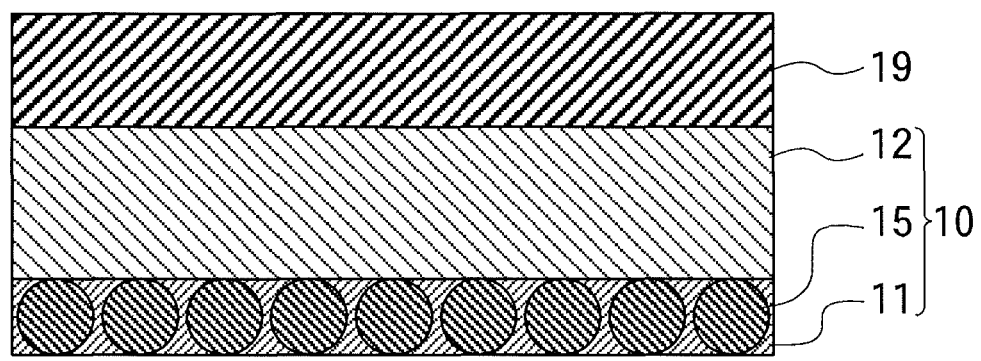
FIG. 1 is a cross-sectional view showing an example of the adhesive film of the present invention.

The adhesive film of the present invention contains at least a first adhesive layer, and a second adhesive layer that is adhered to the first adhesive layer, and optionally further contains suitably selected other layers.
<First Adhesive Layer>
The first adhesive layer contains at least conductive particles, and optionally further contains suitably selected other substances.
—Conductive Particles—
The conductive particles are suitably selected depending on the intended purpose without any restriction. Examples thereof include metal particles each having a metal plating layer formed on a surface thereof, and resin particles each having a metal plating layer formed on a surface thereof.
—Other Substances—
The aforementioned other substances are suitably selected depending on the intended purpose without any restriction. Examples thereof include a thermoplastic resin, a thermosetting resin, a silane coupling agent, and inorganic filler.

The first adhesive layer improves the adhesive force to the second adhesive layer with the addition of the thermoplastic resin, improves the adhesion with an adherend with the addition of the silane coupling agent, and improves flame resistance and insulation property between the adjacent terminals with the addition of the inorganic filler.
—Thermosetting Resin—
The thermosetting resin is suitably selected depending on the intended purpose without any restriction. Examples thereof include epoxy resin, urethane resin and thermosetting polyester resin.

It is not necessary to add a curing agent to the aforementioned first adhesive layer and the second adhesive layer, which will be described later, depending on the type of the thermosetting resin, but the curing speed is increased with the addition of the curing agent.
—Curing Agent—
The curing agent is suitably selected depending on the intended purpose without any restriction. For example, in the case where the thermosetting resin is epoxy resin, the epoxy resin is anionic polymerized in use of a microcapsulated amine curing agent as a curing agent, and cationic polymerized in use of an onium salt or sulfonium salt as a curing agent. Moreover, in the case where the thermosetting resin is the thermosetting polyester, a radical polymerization is taken place in use of organic peroxide as a curing agent.
—Thermoplastic Resin—
The thermoplastic resin is suitably selected depending on the intended purpose without any restriction. Examples thereof include phenoxy resin, thermoplastic polyester resin, and fluororesin.
—Silane Coupling Agent—
The silane coupling agent is suitably selected depending on the intended purpose without any restriction. Examples thereof include vinyl silane, epoxy silane, amino silane, mercapto silane, and isocyanate silane.
—Inorganic Filler—
The inorganic filler is suitably selected depending on the intended purpose without any restriction. Examples thereof include silica, alumina and titania.

The thickness of the first adhesive layer is not particularly restricted. The thickness thereof is preferably less than two times of the average particle diameter of the conductive particles, and preferably 50% to 150% of the average particle diameter of the conductive particles.
<Second Adhesive Layer>
The second adhesive layer is suitably selected depending on the intended purpose without any restriction, provided that it adheres to the first adhesive layer. For example, the second adhesive layer contains thermosetting resin, and optionally further contains suitably selected other substances. The thermosetting resin is as described in the first adhesive layer.
—Other Substance—
The other substance is suitably selected depending on the intended purpose without any restriction. Examples thereof include thermoplastic resin, a silane coupling agent, inorganic filler and conductive particles. The thermoplastic resin, the silane coupling agent, and the inorganic filler are respectively as described in the first adhesive layer. The conductive particles are as described in the first adhesive layer, but the conductive particles contained in the second adhesive layer has smaller density than that of the conductive particles contained in the first adhesive layer.

The second adhesive layer improves the adhesive force with the first adhesive layer with the addition of the thermoplastic resin, improves the adhesion between the second adhesive layer and the adherend with the addition of the silane coupling agent, and improves flame resistance and insulation property between the adjacent terminals with the addition of the inorganic filler.

Moreover, if the viscosity is decreased by heating, it is not necessary to add the thermosetting resin both in the first adhesive layer and the second adhesive layer. For example, only the thermoplastic resin may be contained as the resin component, without adding the thermosetting resin in either or both of the first adhesive layer and the second adhesive layer.

It is preferred that the first adhesive layer and the second adhesive layer has an exothermic peak region of 60° C. to 140° C. in differential scanning calorimetry (DSC). When the exothermic peak is less than 60° C., the first adhesive layer and the second adhesive layer tend to be solidified at the time when the adhesive film is temporarily adhered and fixed to the adherend. When the exothermic peak is more than 140° C., the time required for the final pressure bonding becomes more than 20 seconds, lowering the mass-production efficiency. Note that, the temperature at which the exothermic peak of DSC appears is the curing temperature, meaning that the curing temperature of the first adhesive layer and the second adhesive layer is preferably 60° C. to 140° C.

When there is a significant difference between the curing temperature of the first adhesive layer and the curing temperature of the second adhesive layer, either of the adhesive layers tends to cured before the conductive particles are held between the first adhesive layer and the second adhesive layer. For this reason, the difference in the curing temperature between the first adhesive layer and the second adhesive layer is preferably 10° C. or less.

The first adhesive layer and the second adhesive layer preferably have the viscosity of 10 Pa·s to 100,000 Pa·s. When the viscosity thereof is less than 10 Pa·s, it tends to include air bubbles as the viscosity decreases. When the viscosity thereof is more than 100,000 Pa·s, the adherend may not be pressed into the adhesive layers, and there may be a case where excellent connection resistance cannot be attained.

The lowest viscosity of the second adhesive layer is suitably selected depending on the intended purpose without any restriction, provided that it is lower than the lowest viscosity of the first adhesive layer. It is preferably 0.05 times to 0.2 times of the lowest viscosity of the first adhesive layer.

<Other Layer>

The other layer is suitably selected depending on the intended purpose without any restriction.

Hereinafter, one embodiment of the adhesive film of the present invention will be explained with reference to the drawings.

FIG. 1 shows one example of the adhesive film 10 of the present invention. The adhesive film 10 contains a first adhesive layer 11 in which conductive particles 15 are dispersed, and a second adhesive layer 12 disposed on the surface of the first adhesive layer 11. The conductive particles 15 are dispersed in the first adhesive layer 11 and no conductive particles are disposed in the second adhesive layer 12.

Figure 2:
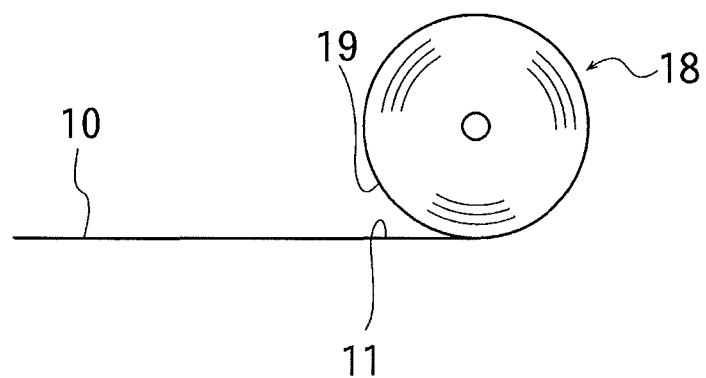
FIG. 2 is a side view showing the state of the adhesive film rolled up in a roll.

A release film 19 is adhesively disposed on the surface of the adhesive film 10, which is the side of the second adhesive layer 12, and as shown in FIG. 2, once the adhesive film 10 is rolled up so as to form a roll 18 in the state where the release film 19 is adhered, the surface of the first adhesive layer 11 is adhered to the back surface of the release film 19.

Figure 3A:
FIG. 3A is a cross-sectional view explaining the process of connecting an electronic part to a substrate (part 1).

FIG. 3A shows one example of a substrate 3, which is an adherend. The substrate 3 is for example a LCD panel or the like, and has a substrate body 31 such as a glass plate, and a plurality of first terminals 35 disposed on the surface of the substrate body 31.

As shown in FIG. 2, the adhesive film 10 is pulled out from the roll 18, the first adhesive layer 11 is released from the back surface of the release film 19, the surface of the first adhesive layer 11 is exposed, and then the adhesive film 10 is cut out in the predetermined shape.

Figure 3B:
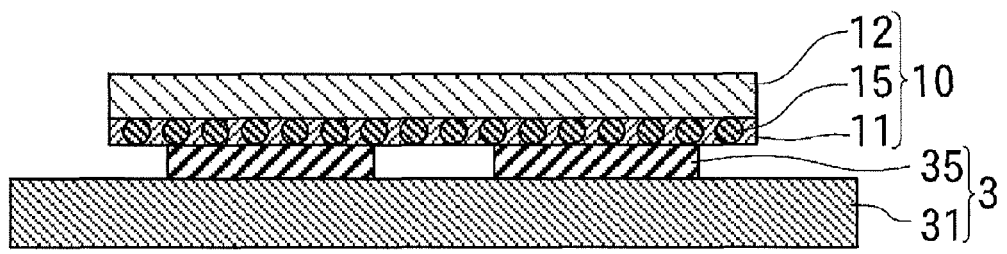
FIG. 3B is a cross-sectional view explaining the process of connecting an electronic part to a substrate (part 2).

The surface of the cut adhesive film 10 where the first adhesive layer 11 is exposed is adhered to the surface of the substrate 3 where the first terminals 35 are exposed, and then temporarily bonded (FIG. 3B).

In the case where the release film 19 is adhered to the cut adhesive film 10, the release film 19 is released before or after temporal bonding, so as to expose the surface of the second adhesive layer 12.

The adherend to which the adhesive film 10 is temporarily bonded is not restricted to the substrate 3. After temporary bonding a surface of an electric part 4 where second terminals 45 are disposed to the surface of the second adhesive layer 12, the temporal fixing may be performed by adhering the surface of the substrate 3 where the first terminals 35 are disposed to the surface of the first adhesive layer 11.

Figure 3C:
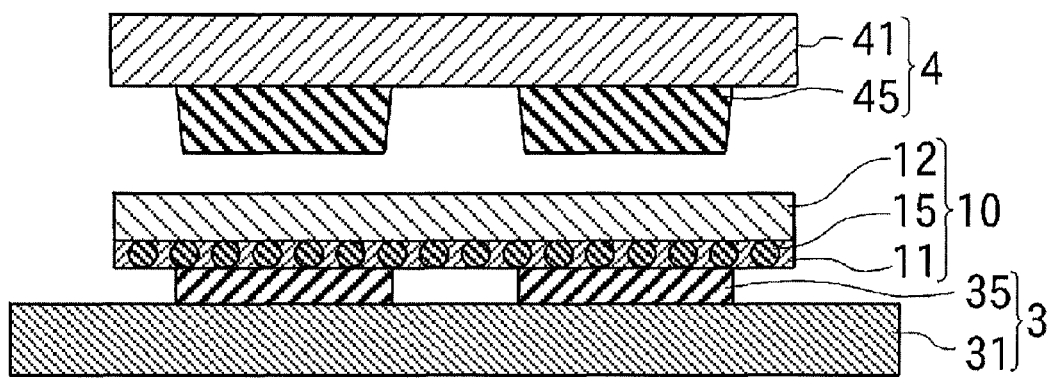
FIG. 3C is a cross-sectional view explaining the process of connecting an electronic part to a substrate (part 3).

In FIG. 3C, the electronic part 4, which is the adherend 4 joined to the substrate 3 and has the smaller planar shape than that of the substrate 3, and the electronic part 4 has a part body 41 and a plurality of second terminals 45 disposed on one surface of the part body 41.

The adherend 4 connected using the adhesive film 10 of the present invention is not particularly restricted, and examples thereof include a semiconductor chip, a resistance element, a chip on film (COF) device and a tape automated bonding (TAB) device.

Figure 3D:
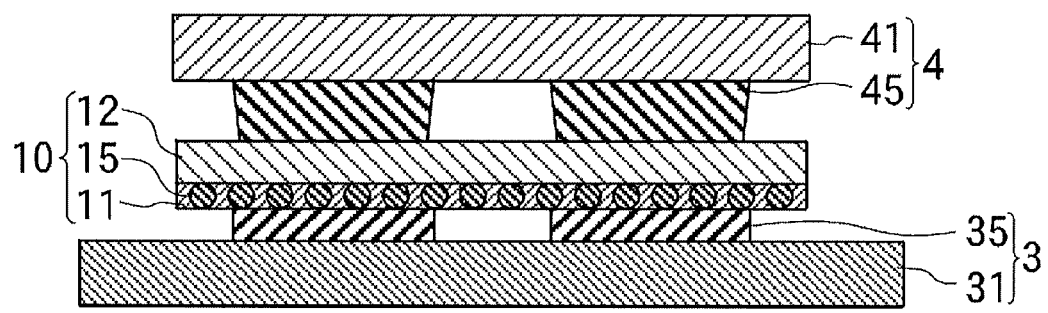
FIG. 3D is a cross-sectional view explaining the process of connecting an electronic part to a substrate (part 4).

A distance between the center positions (i.e., a pitch) of each first terminal 35 and a distance between the center positions of each second terminal 45 (i.e., a space between the bump) are made equal. The electronic part 4 is positioned so that each of the second terminals 45 are located above each of the first terminals 35, and as shown in FIG. 3D, the surface of the electronic part 4 where the second terminals 45 are disposed is adhered to the surface of the second adhesive layer 12 and then temporarily fixed.

A concave portion is formed on each of the surfaces of the substrate 3 and the electronic part 4, between the adjacent first terminals 35 and the adjacent second terminals 45, and the depth of the concave portion is corresponded to the height of the first terminals 35 and the second terminals 45, which are respectively projected to the surfaces of the substrate 3 and the electronic part 4.

The height of the first terminal 35 is lower than the height of the second terminal 45, and the bottom surface of the concave portion between the first terminals 35 may be adhered to the first adhesive layer 11 in the temporal fixed condition. Alternatively, the bottom surface of the concave portion may have some space with the first adhesive layer 11 in the temporal fixed condition, but the distance between the bottom surface to the first adhesive layer 11 is shorter than the distance between the bottom surface of the concave portion between the second terminals 45 to the second adhesive layer 12.

In thin condition, a heating unit is pressed against either or both of the substrate 3 and the electronic part 4, and the substrate 3 and the electronic part 4 are pressed while heating at the temperature higher than that in the temporal fixing so as to carry out a final pressure bonding. Here, as the bottom surface of the concave portion between the first terminals 35 is substantially adhered to the first adhesive layer 11, the first adhesive layer 11 is not pushed out to the portion between the adjacent first terminals 35 through the space between the first terminal 35 and the second terminal 45 facing to the first terminal 35 even when the first adhesive layer 11 is heated and softened.

In addition, the lowest viscosity of the first adhesive layer 11 is lower than the lowest viscosity of the second adhesive layer 12, the first adhesive layer 11 does not tend to flow away to the portion between the adjacent first terminals 35.

In contrast, as the bottom surface of the concave portion 5 between the second terminals 45 has some space to the second adhesive layer 12, the second adhesive layer 12 is pushed out to the portion between the adjacent second terminals 45 through the space between the first terminal 35 and the second terminal 45 facing to the first terminal 35 when the second adhesive layer 12 is heated and softened.

Figure 4:
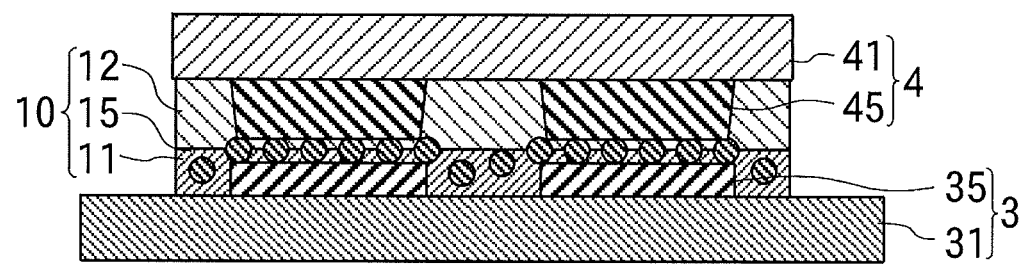
FIG. 4 is a cross-sectional view showing the state of the electronic part connected to the substrate.
Figure 5:
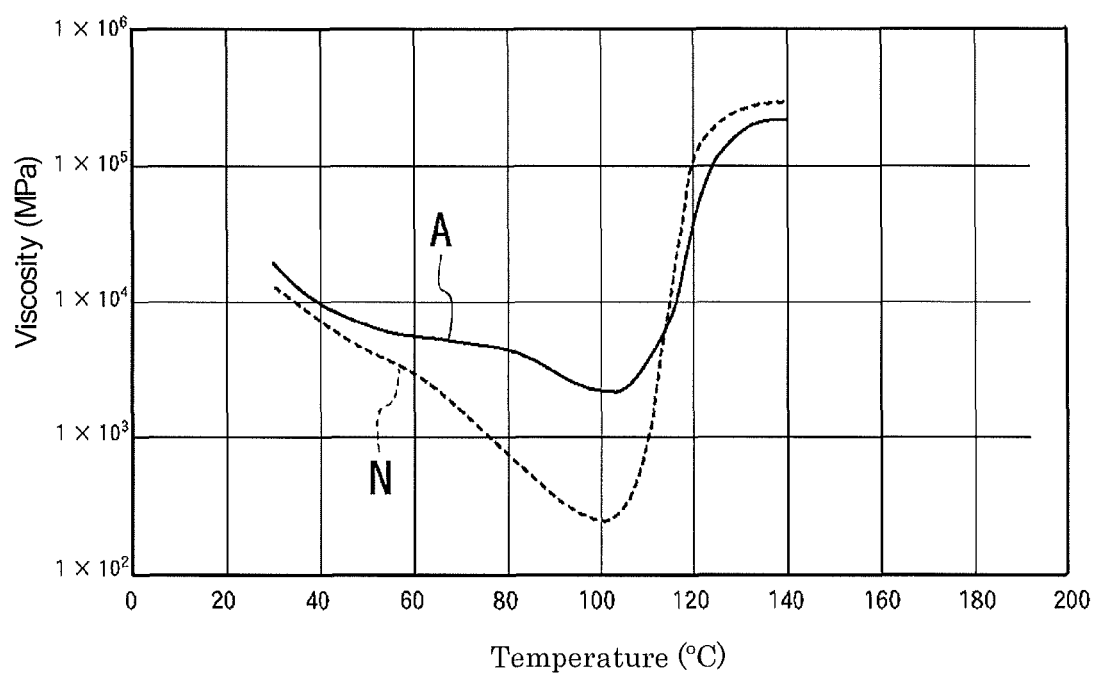
FIG. 5 is a graph showing the relationship between the viscosity and the temperature.

The second adhesive layer 12 has no conductive particles 15 dispersed therein, or has conductive particles 15 dispersed therein but those conductive particles 15 have lower density than those of the first adhesive layer 11. Accordingly, even when the second adhesive layer 12 is pushed out to the portion between the adjacent second terminals 45, no short circuit is occurred between the second terminals 45. The height of the second terminal 45 is larger than the total of the thickness of the second adhesive layer 12 and the average particle diameter of the conductive particles 15, and thus the second terminal 45 pushes the second adhesive layer 12 away so that the edge of the second terminal 45 reaches the first adhesive layer 11, and further pushes the first adhesive layer 11 away to thereby hold the conductive particles 15 between the first terminal 35 and the second terminal 45 (FIG. 4).

The thickness of the first adhesive layer 11 is adjusted to be less than two times of the particle diameter of the conductive particles 15, and no more than 2 particles of the conductive particles 15 are placed in the thickness direction of the first adhesive layer 11. Therefore, the conductive particles 15 do not move in the transverse direction from the space between the first terminal 35 and the second terminal 45 at the time when the conductive particles 15 are held between the first terminal 35 and the second terminal 45.

As the number of the conductive particles 15 captured between the first terminal 35 and the second terminal 45 is increased, the conductive resistance between the first terminal 35 and the second terminal 45 is decreased. In addition, as the conductive particles 15 do not move in the transverse direction, a short circuit does not occur between the adjacent first terminals 35 or the adjacent second terminals 45.

When the heat-pressurization is continued while the first terminal 35 and the second terminal 45 are electrically connected, and the first adhesive layer 11 and the second adhesive layer 12 are respectively heated at the temperature more than the curing temperature, the first adhesive layer 11 and the second adhesive layer 12 are cured in the state where the first adhesive layer 11 and the second adhesive layer 12 are surrounding the first terminal 35 and the second terminal 45, to thereby physically connect the electronic part 4 with the substrate 3.

EXAMPLE

Hereinafter, the present invention is specifically explained with reference to examples and comparative examples thereof, but the examples shall not be construed as to limit the scope of the present invention.

<Preparation of Adhesive>

Phenoxy resin, which was a solid resin, was made dissolved in a solvent (toluene/ethylacetate=1/1) to thereby obtain a solution having a solid content of 30% by weight.

Thereafter, a curing agent, epoxy resin, inorganic filler, a silane coupling agent, and conductive particles were added to and mixed in the solution so that the formulation thereof became as stated in the column "ACF" of Table 1, and then adjusted with toluene so as to have a solid content of 40% by weight to thereby obtain a solution of a joining material.

TABLE 1

| | | | Formulation of Adhesive | | |
|---|---|---|---|---|---|
| | Product name | Softening point | ACF | NCF-1 | NCF-2 |
| Curing agent | HX3941HP | — | 50 parts | 50 parts | 53 parts |
| Epoxy resin | EP828 | — | 9 parts | 9 parts | 13 parts |
| Phenoxy resin | YP70 | 84° C. | 0 part | 0 part | 33 parts |
| | FX280 | 158° C. | 30 parts | 30 parts | 0 part |
| Inorganic filler | | — | 10 parts | 10 parts | 0 part |
| Coupling agent | KBE403 | — | 1 part | 1 part | 1 part |
| Conductive particles | AUL704 | — | Contained | None | None |

In Table 1, "-" stated in the column of the solid content and the softening point means no measurement is conducted.

In Table 1, the product name "HX3941HP" is a microcapsule amine-based epoxy curing agent manufactured by Asahi Kasei Chemicals Corporation, the product name "EP828" is liquid bisphenol A epoxy resin manufactured by Japan Epoxy Resins Co., Ltd., the product name "YP70" is phenoxy resin containing bisphenol A and bisphenol B in its principal chain manufactured by Tohto Kasei Co., Ltd., the product name "FX280" is a fluorene skelton phenoxy resin manufactured by Tohto Kasei Co., Ltd., the product name "KBE403" is epoxy silane manufactured by Shin-Etsu Chemical Co., Ltd., and the product name "AUL704" is Ni/Au plated resin particles (average particle diameter of 4 μm) manufactured by SEKISUI CHEMICAL CO., LTD.

Each of gauges, which were respectively configured to make a film of the joining material have a thickness of 18 μm, 8 μm, and 4 μm on dry basis, was held with two stainless steel rods each in the shape of a column. The solution of the joining material was applied onto a release film having a thickness of 50 μm, and the release film on which the solution was applied was passed through between the stainless steel rods, followed by being left in an oven at the temperature of 90° C. for 3 minutes to evaporate the solvent, to thereby form three adhesive layers (ACF) having a thickness of 18 μm, 8 μm, and 4 μm, respectively.

Then, adhesive layers (NCF-1, NCF-2) were prepared in the same manner as above, provided that the formulation was changed to those stated in the columns of "NCF-1" and "NCF-2" of Table 1, and the thickness was changed to 8 μm and 14 μm.

<Measurement of Viscosity>

The adhesive layer formed with the formulation of each ACF, NCF-1 and NCF-2 was laminated to have a thickness of 100 μm, and the laminate was subjected to the measurements of the lowest viscosity and the temperature at which the lowest viscosity was obtained (reaching temperature) by means of a stress control rheometer (RS150, Haake). Note that, the corn having a diameter of 8 mm and an angle of 2 degrees was used, and the temperature range for the measurement was 30° C. to 250° C. The results are shown in Table 2 below.

TABLE 2

| Lowest Viscosity and Reaching Temperature | | | |
|---|---|---|---|
| Lowest viscosity | ACF | NCF-1 | NCF-2 |
| Viscosity | $1.1 \times 10^4$ Pa·s | $1.1 \times 10^4$ Pa·s | $1.2 \times 10^2$ Pa·s |
| Reaching temperature | 101° C. | 101° C. | 101° C. |

From Tables 1 and 2, it was found that ACF and NCF-1, which had the same formulation to ACF other than the conductive particles 15 had the same lowest viscosity and reaching temperature regardless of the presence of the conductive particles 15. On the other hand, NCF-2 had the same reaching temperature to ACF and NCF-1, but the lowest viscosity thereof was lower than those of ACF and NCF-1.

NCF-2 had the different formulations of the epoxy resin that was the thermosetting resin and the curing agent, different type and formulation of the phenoxy resin that was the thermoplastic resin, and the different formulation of the inorganic filler from those of ACF and NCF-1, and thus it was found that the lowest viscosity was adjustable by changing the types or formulations of the thermosetting resin, curing agent, thermoplastic resin and organic filler.

<Production of Adhesive Film>

Adhesive films of Examples 1 to 2 and Comparative Examples 1 to 2 were produced by bonding ACF having a thickness of 4 μm, NCF-1 having a thickness of 14 μm, and NCF-2 having a thickness of 14 μm in the combination stated in Table 3.

TABLE 3

| | | Structure of Adhesive Film | | | |
|---|---|---|---|---|---|
| | | Comparative Example 1 | Comparative Example 2 | Example 1 | Example 2 |
| ACF layer | Thickness | 18 μm | 4 μm | 4 μm | 4 μm |
| | Particle concentration | 8,000/mm² | 8,000/mm² | 8,000/mm² | 3,000/mm² |
| NCF layer | Formulation | None | NCF-1 | NCF-2 | NCF-2 |
| | Thickness | None | 14 μm | 14 μm | 14 μm |

ACF having a thickness of 18 μm was made as the adhesive film of Comparative Example 1. In addition, the adhesive film of Example 2 was produced in the same structure as that of Example 1, provided that the concentration of the conductive particles in ACF was changed from 8,000 particles per 1 mm² to 3,000 particles per 1 mm².

<Mounting Step>

As an adherend, an IC chip (IC for evaluation, the material: silicon, size: 6.0 mm×6.0 mm, thickness: 0.4 mm, bump: gold stud, bump thickness: 20 μm, bump area: 60 μm×60 μm, space between the bumps: 20 μm, pitch: 80 μm), and an ITO coating glass (ITO glass for evaluation, product name: 1737F manufactured by Corning Incorporated, glass size: 50 mm in length×30 mm in width×0.5 mm in thickness, ITO pad size: 60 μm×60 μm, pitch: 80 μm) were prepared.

At first, each of the adhesive films of Examples 1 to 2 and Comparative Examples 1 to 2 cut into the shape of 7.0 mm×7.0 mm was placed on the ITO coating glass, and pressed by a pressure bonding device (tool size: 8.0 mm×8.0 mm) with a buffering material (Teflon (registered trademark) having a thickness of 70 μm) being between the adhesive film and the device at 80° C., 1 MPa for 2 seconds to temporarily bond to the ITO coating glass.

Thereafter, IC chips were aligned on the ITO coating glass and temporarily fixed, and then pressed by means of the same pressure bonding device used for the temporary bonding with a buffering material (Teflon (registered trademark) having a thickness of 70 μm) being between the IC chips and the device at 190° C., 3 MPa for 10 seconds so as join the IC chips to the ITO coating glass to thereby obtain joined structured of Examples 1 to 2, and Comparative Examples 1 to 2.

Note that, as the surface areas of the bump and the ITO pad were respectively 60 μm×60 μm, the total joined area of the bump and the ITO pad was 3,600 μm².

These four joined structures were subjected to the measurements of the following "captured particle number," "capturing efficiency," "conductive resistance" and "short circuit occurring rate."

[Captured Particle Number]

After the final pressure bonding, the number of the conductive particles remained on each bump was counted at the twenty bumps.

[Capturing Efficiency]

The capturing efficiency is a value which shows the number of the particles captured after the final pressure bonding based on a percentage. Specifically, the number (average) of the conductive particles present under each bump was counted with respect to twenty bumps at the time when the IC chips were temporarily fixed, and this number of the conductive particles and the captured particle number (average) after the final pressure bonding were inserted into the following formula 1 and the capturing efficiency was calculated.

Capturing efficiency(%)=(Captured particle number after final pressure bonding)/(Number of particles present under IC chip bump after temporary fixation of IC chip)×100　　　Formula 1

[Conductive Resistance]

The conductive resistance (unit: Ω) between the bump of the IC chip and the ITO pad was measured after the final pressure bonding. The results of the maximum value, minimum value, and average value of "captured particle number," "capturing efficiency," and "conductive resistance" are shown in Table 4 below.

TABLE 4

Captured particle number, Capturing efficiency, Conductive resistance

|  |  | Comparative Example 1 | Comparative Example 2 | Example 1 | Example 2 |
|---|---|---|---|---|---|
| Captured particle number (per terminal) | Max. | 12 | 13 | 28 | 10 |
|  | Min. | 4 | 4 | 14 | 6 |
|  | Ave. | 7 | 7 | 21 | 8 |
| Capturing efficiency |  | 24.3% | 24.3% | 73.0% | 75.1% |
| Conductive resistance | Max. | 0.68 | 0.68 | 0.62 | 0.67 |
|  | Min. | 0.42 | 0.42 | 0.41 | 0.42 |
|  | Ave. | 0.54 | 0.54 | 0.51 | 0.54 |

(joined area = 3,600 µm², measuring number N = 20)

As clear from Table 4, the capturing efficiency of Examples 1 and 2 was higher than that of Comparative Examples 1 and 2. Example 2 had the similar degrees of the captured particle number and conductive resistance to those of Comparative Examples 1 and 2, regardless of the fact that the concentration of the conductive particles of Example 2 was half of those of Comparative Examples 1 and 2.

From the fact mentioned above, it was found that high conduction reliability could be attained by making the lowest viscosity of the first adhesive layer higher than that of the second adhesive layer and making the thickness of the first adhesive layer approximately less than 2 times of the particle diameter of the conductive particles, without increasing the concentration of the conductive particles.

[Short Circuit Occurring Rate]

Joined structures were produced using adhesive films of Examples 1 to 2 and Comparative Examples 1 to 2, respectively, in the same conditions as in the aforementioned "mounting step", provided that the bump and ITO pad were misaligned so as to be 10 µm apart from the predetermined position in the horizontal direction at the time of when the IC chip and the ITO coating glass were joined to each other. A voltage of 30V was applied between the adjacent ITO pads, and the insulation resistance was measured. The insulation resistance of $1.0 \times 10^{-6} \Omega$ or less was regarded as an occurrence of a short circuit, and the number of the short circuit occurred was counted (initial).

After leaving the joined structure in the conductive state under the condition at the temperature of 85° C. and humidity of 85% for 500 hours, the number of the short circuit occurred was counted (left at high temperature high humidity). The number of the short circuit occurred was counted at 400 places, and a short circuit occurring rate (%) of the initial and after left at high temperature and high humidity was obtained. The results are shown in Table 5.

TABLE 5

Short Circuit Occurring Rate

|  |  | Comparative Example 1 | Comparative Example 2 | Example 1 | Example 2 |
|---|---|---|---|---|---|
| Short circuit occurring rate | Initial | 1.00% | 1.50% | 0.40% | 0.25% |
|  | 85° C./85%/500 h | 2.00% | 2.50% | 0.75% | 0.50% |

(measuring number N = 400)

As it is clear from the results shown in Table 5, it is found that Examples 1 and 2 had lower short circuit occurring rates at the initial and after left in high temperature and high humidity compared to Comparative Examples 1 and 2, and the amount of the conductive particles moved from the position between the terminals facing to each other to the position between the terminals adjacent to each other is small.

In Examples presented above, the adhesive film 10 was produced by bonding the first adhesive layer 11 and second adhesive layer 12 both of which had been formed into a film, but the present invention would not be limited to those examples.

For example, the materials of the second adhesive layer 12 are made dissolved or dispersed into a solvent to prepare a coating liquid, and the coating liquid is applied onto a surface of the first adhesive layer 11, followed by drying, so that the second adhesive layer 12 can be adhered to and disposed on the surface of the first adhesive layer 11.

Moreover, a coating liquid in which the materials of the first adhesive layer 11 and the conductive particles 15 are made dissolved or dispersed is prepared, and the coating liquid is applied onto a surface of the second adhesive layer 12, followed by drying, so that the second adhesive layer 12 can be adhered to and disposed on the surface of the first adhesive layer 11. The first adhesive layer 11 and the second adhesive layer 12 may be each adhered to a separate release film 19, not restricted to the case where they are adhered to front and back surfaces of the release film 19, respectively.

The first adhesive layer 11 may be adhered to and disposed on the surface of the second adhesive layer 12 after forming the first adhesive layer 11 by preparing an adhesive paste in which the conductive particles 15 are disposed and directly applied onto the substrate 3.

Moreover, after forming the second adhesive layer 12 by applying an adhesive paste onto the electronic part 4, the first adhesive layer 11 may be adhered to and disposed on the surface of the second adhesive layer 12.

What is claimed is:

1. An adhesive film, comprising:
 a first adhesive layer comprising conductive particles dispersed therein, a thermoplastic resin and a thermosetting resin; and a second adhesive layer adhered to the first adhesive layer, comprising a thermosetting resin and a thermoplastic resin, wherein the lowest viscosity of the first adhesive layer attained at or below a curing temperature thereof is higher than the lowest viscosity of the second adhesive layer attained at or below a curing temperature thereof, where the curing temperature is a temperature at which the adhesive layer starts to cure, wherein the first adhesive layer and the second adhesive layer are respectively disposed at a side of a substrate and a side of an electronic part, and the adhesive film is configured to join the electronic part and the substrate by heating and pressurizing the substrate and the electronic part with the adhesive film being therebetween, wherein the first adhesive layer has a thickness which is less than two times of an average particle diameter of the conductive particles, wherein the lowest viscosity of the second adhesive layer is 0.05 times to 0.2 times of the lowest viscosity of the first adhesive layer containing the conductive particles, and wherein the temperature at which the first adhesive layer has the lowest viscosity is the same temperature as the temperature at which the second adhesive layer has the lowest viscosity.

2. A joining method, comprising:

placing a terminal of a substrate and a terminal of an electronic part so as to face to each other with an adhesive film intervening therebetween, the adhesive film comprising a first adhesive layer comprising conductive particles dispersed therein, a thermoplastic resin and a thermosetting resin and a second adhesive layer adhered to the first adhesive layer, comprising a thermosetting resin and a thermoplastic resin; and heating and pressurizing the substrate and the electronic part so as to join the substrate and the electronic part with the conductive particles being held between the terminal of the substrate and the terminal of the electronic part, wherein the lowest viscosity of the first adhesive layer attained at or below a curing temperature thereof is higher than the lowest viscosity of the second adhesive layer attained at or below a curing temperature thereof, where the curing temperature is a temperature at which the adhesive layer starts to cure, wherein the first adhesive layer and the second adhesive layer are respectively disposed at a side of the substrate and a side of the electronic part, and the adhesive film is configured to join the electronic part and the substrate by heating and pressurizing the substrate and the electronic part with the adhesive film being therebetween, wherein the first adhesive layer has a thickness which is less than two times of an average particle diameter of the conductive particles, wherein the lowest viscosity of the second adhesive layer is 0.05 times to 0.2 times of the lowest viscosity of the first adhesive layer containing the conductive particles, and wherein the temperature at which the first adhesive layer has the lowest viscosity is the same temperature as the temperature at which the second adhesive layer has the lowest viscosity.

3. A joined structure, comprising
a substrate comprising a terminal; and
an electronic part comprising a terminal,
wherein the substrate and the electronic part are joined by a method comprising:
placing the terminal of the substrate and the terminal of the electronic part so as to face to each other with an adhesive film intervening therebetween, the adhesive film comprising a first adhesive layer comprising conductive particles dispersed therein, a thermoplastic resin and a thermosetting resin and a second adhesive layer adhered to the first adhesive layer, comprising a thermosetting resin and a thermoplastic resin; and heating and pressurizing the substrate and the electronic part so as to join the substrate and the electronic part with the conductive particles being held between the terminal of the substrate and the terminal of the electronic part, wherein the lowest viscosity of the first adhesive layer attained at or below a curing temperature thereof is higher than the lowest viscosity of the second adhesive layer attained at or below a curing temperature thereof, where the curing temperature is a temperature at which the adhesive layer starts to cure, wherein the first adhesive layer and the second adhesive layer are respectively disposed at a side of the substrate and a side of the electronic part, and the adhesive film is configured to join the electronic part and the substrate by heating and pressurizing the substrate and the electronic part with the adhesive film being therebetween, wherein the first adhesive layer has a thickness which is less than two times of an average particle diameter of the conductive particles, wherein the lowest viscosity of the second adhesive layer is 0.05 times to 0.2 times of the lowest viscosity of the first adhesive layer containing the conductive particles, and wherein the temperature at which the first adhesive layer has the lowest viscosity is the same temperature as the temperature at which the second adhesive layer has the lowest viscosity.

4. An adhesive film comprising:

a first adhesive layer comprising conductive particles dispersed therein, a thermoplastic resin and a thermosetting resin; and a second adhesive layer adhered to the first adhesive layer, comprising a thermosetting resin and a thermoplastic resin, wherein the lowest viscosity of the first adhesive layer attained at or below a curing temperature thereof is higher than the lowest viscosity of the second adhesive layer attained at or below a curing temperature thereof, where the curing temperature is a temperature at which the adhesive layer starts to cure, wherein the first adhesive layer and the second adhesive layer are respectively disposed at a side of a substrate and a side of an electronic part, and the adhesive film is configured to join the electronic art and the substrate by heating and pressurizing the substrate and the electronic part with the adhesive film being therebetween, wherein the first adhesive layer has a thickness which is less than two times of an average particle diameter of the conductive particles, wherein a capturing efficiency of the conductive particles is 70% or greater, and wherein the temperature at which the first adhesive layer has the lowest viscosity is the same temperature as the temperature at which the second adhesive layer has the lowest viscosity.

5. A joining method comprising:

placing a terminal of a substrate and a terminal of an electronic part so as to face to each other with an adhesive film intervening therebetween, the adhesive film comprising a first adhesive layer comprising conductive particles dispersed therein, a thermoplastic resin and a thermosetting resin, and a second adhesive layer adhered to the first adhesive layer, comprising a thermosetting resin and a thermoplastic resin; and heating and pressurizing the substrate and the electronic part so as to join the substrate and the electronic part with the conductive particles being held between the terminal of the substrate and the terminal of the electronic part, wherein the lowest viscosity of the first adhesive layer attained at or below a curing temperature thereof is higher than the lowest viscosity of the second adhesive layer attained at or below a curing temperature thereof, where the curing temperature is a temperature at which the adhesive layer starts to cure, wherein the first adhesive layer and the second adhesive layer are respectively disposed at a side of the substrate and a side of the electronic art and the adhesive film is configured to join the electronic part and the substrate by heating and pressurizing the substrate and the electronic part with the adhesive film being therebetween, wherein the first adhesive layer has a thickness which is less than two times of an average particle diameter of the conductive particles, wherein a capturing efficiency of the conductive particles is 70% or greater, and wherein the temperature at which the first adhesive layer has the lowest viscosity is the same temperature as the temperature at which the second adhesive layer has the lowest viscosity.

6. A joined structure comprising:

a substrate comprising a terminal; and an electronic part comprising a terminal, wherein the substrate and the electronic part are joined by a method comprising:

placing the terminal of the substrate and the terminal of the electronic part so as to face to each other with an adhesive film intervening therebetween, the adhesive film comprising a first adhesive layer comprising conductive particles dispersed therein, a thermoplastic resin and a thermosetting resin, and a second adhesive layer adhered to the first adhesive layer, comprising a thermosetting rein and a thermoplastic resin; and heating and pressurizing the substrate and the electronic part so as to join the substrate and the electronic part with the conductive particles being held between the terminal of the substrate and the terminal of the electronic part, wherein the lowest viscosity of the first adhesive layer attained at or below a curing temperature thereof is higher than the lowest viscosity of the second adhesive layer attained at or below a curing temperature thereof, where the curing temperature is a temperature at which the adhesive layer starts to cure, wherein the first adhesive layer and the second adhesive layer are respectively disposed at a side of the substrate and a side of the electronic part, and the adhesive film is configured to join the electronic part and the substrate by heating and pressurizing the substrate and the electronic part with the adhesive film being therebetween, wherein the first adhesive layer has a thickness which is less than two times of an average particle diameter of the conductive particles, wherein a capturing efficiency of the conductive particles is 70% or greater, and wherein the temperature at which the first adhesive layer has the lowest viscosity is the same temperature as the temperature at which the second adhesive layer has the lowest viscosity.

7. The adhesive film according to claim 1, wherein a particle concentration of the conductive particles is $3,000/mm^2$ to $8,000/mm^2$.

8. The joining method according to claim 2, wherein a particle concentration of the conductive particles is $3,000/mm^2$ to $8,000/mm^2$.

9. The joined structure according to claim 3, wherein a particle concentration of the conductive particles is $3,000/mm^2$ to $8,000/mm^2$.

10. The adhesive film according to claim 4, wherein a particle concentration of the conductive particles is $3,000/mm^2$ to $8000/mm^2$.

11. The joining method according to claim 5, wherein a particle concentration of the conductive particles is $3,000/mm^2$ to $8,000/mm^2$.

12. The joined structure according to claim 6, wherein a particle concentration of the conductive particles is $3,000/mm^2$ to $8,000/mm^2$.

13. The adhesive film according to claim 4, wherein the lowest viscosity of the second adhesive layer is 0.05 times to 0.2 times of the lowest viscosity of the first adhesive layer containing the conductive particles.

14. The adhesive film according to claim 1, wherein the first adhesive layer has a thickness which is 50% to 150% of an average particle diameter of the conductive particles.

15. The joining method according to claim 2, wherein the first adhesive layer has a thickness which is 50% to 150% of an average particle diameter of the conductive particles.

16. The joined structure according to claim 3, wherein the first adhesive layer has a thickness which is 50% to 150% of an average particle diameter of the conductive particles.

17. The adhesive film according to claim 4, wherein the first adhesive layer has a thickness which is 50% to 150% of an average particle diameter of the conductive particles.

18. The joining method according to claim 5, wherein the first adhesive layer has a thickness which is 50% to 150% of an average particle diameter of the conductive particles.

19. The joined structure according to claim 6, wherein the first adhesive layer has a thickness which is 50% to 150% of an average particle diameter of the conductive particles.

* * * * *